United States Patent
Ayres et al.

(10) Patent No.: US 6,320,749 B1
(45) Date of Patent: Nov. 20, 2001

(54) ZERO HEIGHT POWER UNIT SHELF SYSTEM

(76) Inventors: John W. Ayres, 12118 Golden Meadow La., Forney, TX (US) 75126; Vincent Byrne, 2304 Homestead Dr., Mesquite, TX (US) 75181; Timothy F. Conway, 2425 Rachel Dr., Rockwall, TX (US) 75032; Edward C. Fontana, 319 Columbia Dr., Rockwall, TX (US) 75087

(*) Notice: Subject to any disclaimer, the term of this patent is extended or adjusted under 35 U.S.C. 154(b) by 0 days.

(21) Appl. No.: 09/385,153

(22) Filed: Aug. 30, 1999

(51) Int. Cl.[7] .............................. H05K 5/00; H05K 5/04; H05K 5/06
(52) U.S. Cl. .................... 361/730; 361/801; 361/829; 361/752
(58) Field of Search ...................... 361/730, 726, 361/727, 740, 741, 715, 800, 801, 802, 825, 752; 312/334.27, 223.1, 9.47; 220/592.01

(56) References Cited

U.S. PATENT DOCUMENTS

| | | | |
|---|---|---|---|
| 4,342,002 | * 7/1982 | Gabr | 330/65 |
| 5,277,615 | * 1/1994 | Hastings et al. | 439/377 |
| 5,507,650 | * 4/1996 | Larabell | 439/61 |
| 5,768,099 | * 6/1998 | Radloff et al. | 361/685 |
| 5,818,696 | * 10/1998 | Knoop | 361/730 |
| 5,909,935 | 6/1999 | Esperandieu et al. | 312/333 |
| 5,921,644 | * 7/1999 | Brunel et al. | 312/223.2 |
| 6,058,007 | * 5/2000 | Eckert et al. | 361/684 |
| 6,154,361 | * 11/2000 | Anderson et al. | 361/685 |
| 6,169,661 | * 1/2001 | Lee | 361/752 |

* cited by examiner

*Primary Examiner*—Jeffrey Gaffin
*Assistant Examiner*—Hung Bui (57) ABSTRACT

The present invention provides a receptacle configured to receive an electronics module for use with an electronics equipment chassis. In one embodiment, the receptacle has a torsion bar, to which is coupled a first planar sidewall with a boss located on an inside planar surface, the boss configured to cooperatively engage a first notch formed on a rear wall of an electronics module. The first sidewall also has a locking slot formed in its front edge lo configured to receive a first locking cam associated with the electronics module, the locking slot cooperating with the locking cam and the boss to create a longitudinal compressive force along the first planar sidewall. A second planar sidewall opposing the first planar sidewall is coupled to the torsion bar.

36 Claims, 5 Drawing Sheets

ZERO HEIGHT POWER UNIT SHELF SYSTEM

TECHNICAL FIELD OF THE INVENTION

The present invention is directed, in general, to an electronics equipment chassis and, more specifically, to a receptacle to be mounted on an electronics equipment chassis to receive an electronics module.

BACKGROUND OF THE INVENTION

A substantial portion of electronics equipment used in the telecommunications and other industries is manufactured and put in service in modular form. Various modular subassemblies are then combined to make up a unit or item of electronics equipment. These modules are generally housed together in a single chassis, such as a rack or cabinet. For example, a power system that has several rectifier components may provide for a separate module to hold each rectifier, all of which is housed together in a single rack or cabinet.

Most modules have a conductive metal case with a multi-pin electrical connector on the rear wall. The cabinets and racks are generally configured to support the modules on shelving attached to a chassis. The shelving may also have sidewalls to compartmentalize the modules and guide mechanisms to position the module so the electrical connector on the module engages a corresponding electrical connector on the chassis. In most cases the chassis of the rack or cabinet also supports and carries the wiring from an external power source to the modules as well as providing a path for the wiring to provide electrical interconnectivity between modules. While a number of prior art cabinet and rack designs exist to hold electronics modules, they all share one common feature, which is the shelving that is used to hold and support the electronics modules.

The current trend in the electronics industry is towards smaller, more compact and dense electronics systems and equipment with more complex circuits. Increased circuit complexity usually means more space is required for components, which conflicts with the trend towards smaller, more compact electronics systems. This dilemma has been solved, in part, by the structural design and arrangement of the cabinets and racks housing the modules.

A typical cabinet or rack that is used to house such modules consumes a surprisingly significant volume of space. Because shelving is designed to structurally support a number of electronics modules, the shelving is reinforced by crossbars or some other method to add to shelf stiffness in order to support the weight of the modules. Other methods to add stiffness include folding the shelf edge into a supporting structure and molding indentations into the shelves to add stiffness. In each case where a shelf supports weight, stiffness is directly related to thickness. This thickness then consumes cabinet volume that could be used to house active electronics. For example, if a shelf holds 3.5 inch high modules has a total thickness of three-eighths of an inch, approximately 9.67% of the cabinet volume available for shelving and modules is occupied by shelving. Thus, a significant problem with these conventional chassis is that a significant amount of volume is occupied by the support and shelving structures.

Therefore, what is needed in the art is a device to secure and support electronics modules in a cabinet or rack without sacrificing any more internal housing volume than is necessary.

SUMMARY OF THE INVENTION

To address the above-discussed deficiencies of the prior art, the present invention provides a receptacle that is configured to receive an electronics module therein. The receptacle as provided by the present invention is particularly useful in electronic equipment chassis, such as those used in the telecommunications industry. In one embodiment, the receptacle has a torsion bar that is coupled to a first planar sidewall. The first planar sidewall includes a boss that is located on an inside planar surface of the first planar sidewall. The boss is configured to cooperatively engage a first notch formed on a rear wall of an electronics module. The first sidewall also has a locking slot formed in its front edge that is configured to receive a first locking cam associated with the electronics module. The locking slot cooperates with the locking cam and the boss to create a longitudinal compressive force along the first planar sidewall. A second planar sidewall that opposes the first planar sidewall is coupled to the torsion bar.

Thus, in broad scope, the present invention provides a receptacle having a unique configuration and cooperation between it various components that is capable of supporting the weight of a module while requiring or occupying less internal housing volume than conventional support structures, thereby allowing a higher density of modules to be housed within an electronics chassis.

A favorable embodiment of the invention provides a boss on an inside planar surface of a second planar sidewall. The boss is configured to cooperatively engage a second notch on a rear wall of an electronics module. The second planar sidewall further includes a locking slot on the front edge that is configured to receive a second locking cam associated with the electronics module. The locking slot on the second planar sidewall cooperates with the second locking cam and the boss to create a longitudinal compressive force on the electronics module along the second planar sidewall.

Another embodiment of the invention provides for the first planar sidewall to include a track located on the bottom edge that is configured to receive and guide the electronics module. In yet another aspect, the invention provides for the second planar sidewall to include a track located on the bottom edge that is configured to receive and guide the electronics module.

In yet another useful embodiment, the invention provides for a third planar sidewall of an adjacent receptacle, where the third planar sidewall is contiguous with either the first or second planar sidewalls and has a locking tab formed thereon. In this particular embodiment, the first or second planar sidewalls have a corresponding locking tab receiver formed thereon that is configured to cooperatively engage the locking tab and secure the third planar sidewall to either of the first or second planar sidewalls. In another aspect, the third planar sidewall may further include an alignment boss that cooperatively engages a corresponding boss receiver formed on the first or second planar sidewalls.

In another embodiment, the receptacle has an electrical connector coupled to the torsion bar, which preferably includes a passageway formed through it, and that is configured to cooperatively engage a corresponding electrical connector on the electronics module. In yet another embodiment, the present invention provides for an electromagnetic interference (EMI) cover configured to cover at least a portion of the torsion bar.

In another embodiment, the receptacle has a guide plate coupled to a bottom edge of the torsion bar that extends from the bottom edge of the torsion bar toward the first and second planar sidewalls and that is configured to provide an alignment force against a bottom surface of the electronics module. In one aspect of this particular embodiment, the guide plate includes a front edge adjacent to the first and second planar sidewalls that has an indentation formed therein. The guide plate in conjunction with the electronic module provide a scissoring action between an edge of the electronics module and the guide plate as the electronics module is being inserted.

Another aspect of the present invention provides for an electronics equipment chassis consisting of a frame and an electronics module receptacle that is couplable to the frame. One embodiment includes a plurality of electronics modules that are couplable to the frame. In yet another embodiment, the electronics equipment chassis further includes a plurality of electronics modules couplable thereto.

The present invention also provides a method of manufacturing a receptacle configured to receive an electronics module for use with an electronics equipment chassis. The method, in one embodiment, comprises forming a torsion bar, forming a first planar sidewall and forming a second planar sidewall that opposes the first planar sidewall. Both the first and second planar sidewalls are coupled to the torsion bar. The formation of the first planar sidewall includes forming a boss located on an inside planar surface thereof wherein the boss is configured to cooperatively engage a notch formed on a rear wall of the electronics module. The first planar sidewall further includes a locking slot formed in its front edge that is configured to receive a locking cam associated with an electronics module. The locking slot cooperates with the locking cam and the boss to create a longitudinal compressive force along the first planar sidewall. Another embodiment of the invention provides for a method of manufacturing an electronics equipment chassis that includes the above-discussed method for manufacturing the receptacle, which is discussed in more detail below.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
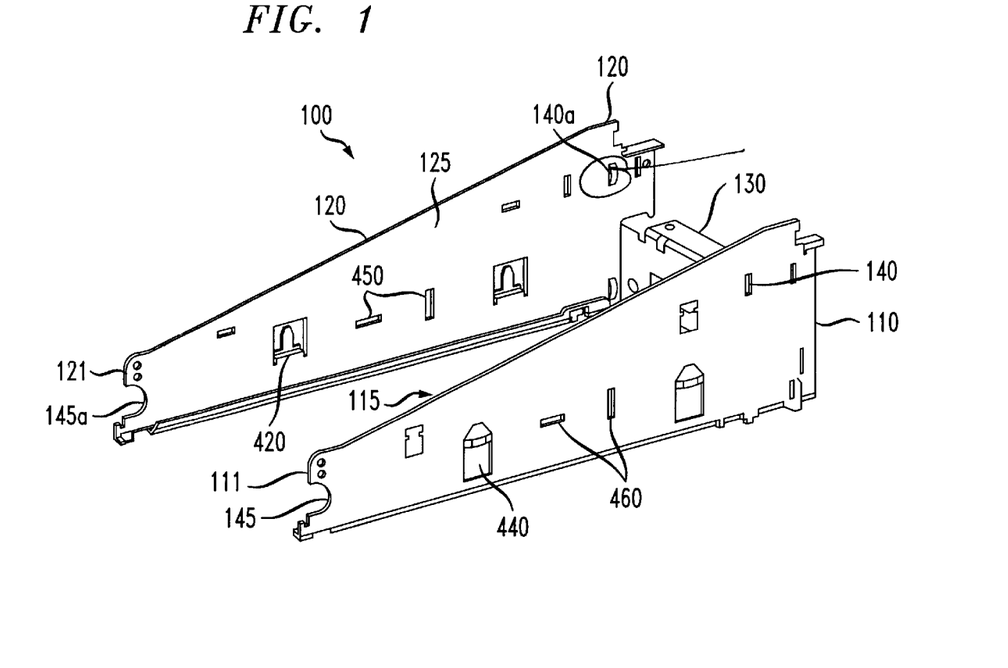
FIG. 1 illustrates an isometric view of a receptacle constructed in accordance with the present invention that is configured to receive an electronics module for use with an electronics equipment chassis.

Turning initially to FIG. 1, there is illustrated a receptacle 100 constructed in accordance with the present invention. The receptacle 100 is configured to receive an electronics module therein and can be used with an electronics equipment chassis, such as a telecommunications chassis.

Figure 2:
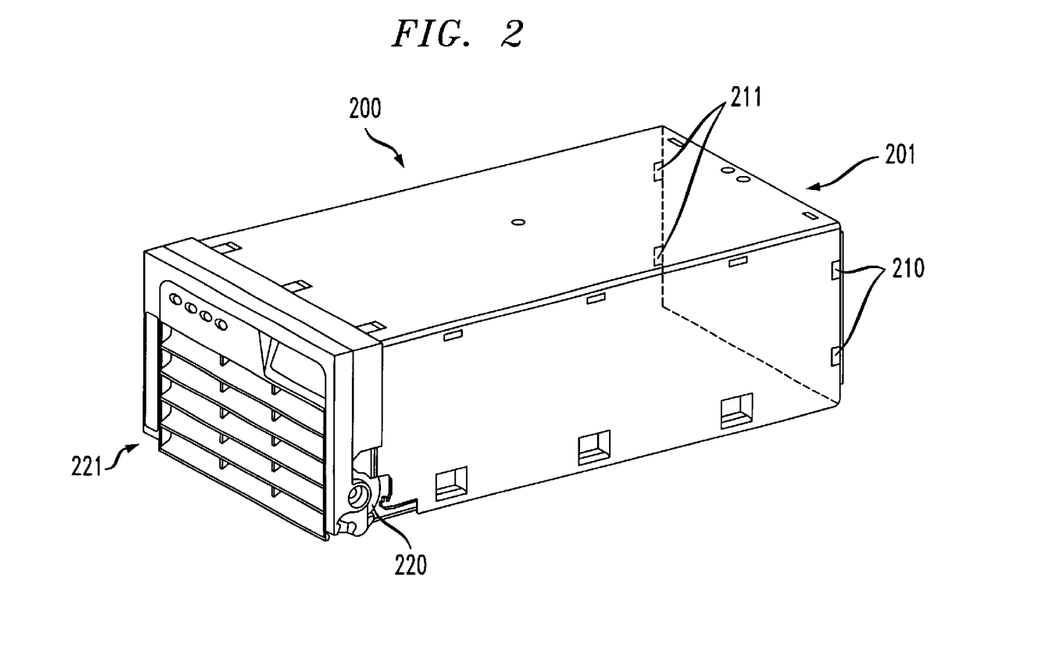
FIG. 2 illustrates an isometric view of an electronics module of a type received by the receptacle illustrated in FIG. 1.

FIG. 2 illustrates an electronics module 200 of a type received by the receptacle 100 illustrated in FIG. 1. Reference will initially be made to FIGS. 1 and 2 to describe the cooperation of the receptacle 100 and the electronics module 200.

The receptacle 100 illustrated in FIG. 1 has a first planar sidewall 110 and a second planar sidewall 120 coupled to a torsion bar 130 and positioned in opposition to one another. Located on an inside planar surface 115 of the first planar sidewall 110 is a boss 140 configured to cooperatively engage a first notch 210 that is formed on a rear wall 201 of the electronics module 200. On a front edge 111 of the first planar sidewall 110 is a locking slot 145 to receive a first locking cam 220 that is associated with the electronics module 200.

The locking slot 145 and boss 140 are configured so that the boss 140 is engaged by the first notch 210, when the electronics module 200 is positioned in the receptacle 100. The locking slot 145 cooperates with the first locking cam 220 and boss 140 to create a longitudinal compressive force on the module 200 along the first planar sidewall 110.

In one embodiment, the second planar sidewall 120 may also include a boss 140a on an inside planar surface 125 that is configured to engage a second notch 211 (not visible) formed on the rear wall 201 of the electronics module 200. The second planar sidewall 120 also has a front edge 121 that may also include a locking slot 145a to receive a second locking cam 221 (not visible) that is associated with the electronics module 200. The locking slot 145a and boss 140a are configured so that the boss 140a is engaged by the second notch 211, when an electronics module 200 is positioned in the receptacle 100. The locking slot 145a cooperates with the second locking cam 221 and boss 140a to also create a longitudinal compressive force on the module 200 along the second planar sidewall 120. This is a particularly useful embodiment because, when both the first and second planar sidewalls 110, 120 have bosses 140, 140a and locking notches 145, 145a, the module 200 is secured by a compressive force along both planar sidewalls 110, 120. Thus, the additional support of shelving found in conventional devices is not needed, which, in turn, means that less internal volume is required to house a module 200.

Another embodiment may further include a plurality of bosses 140, 140a on the inside planar surfaces 115, 125 that are configured to engage a plurality of notches 210, 211 on the rear wall 201 of the module 200. Using a plurality of bosses 140, 140a provides additional structure against which a compressive force can be exerted and adds support to secure the module 200 in the receptacle 100.

The embodiments described thus far permit an electronics module 200 to be placed in a receptacle 100 and secured therein without using shelving to support and hold the module 200. This permits space previously used by shelving to be allocated to additional functional electronic components or, alternatively, the size of the cabinet or rack housing the modules 200 can be reduced.

Figure 3A:
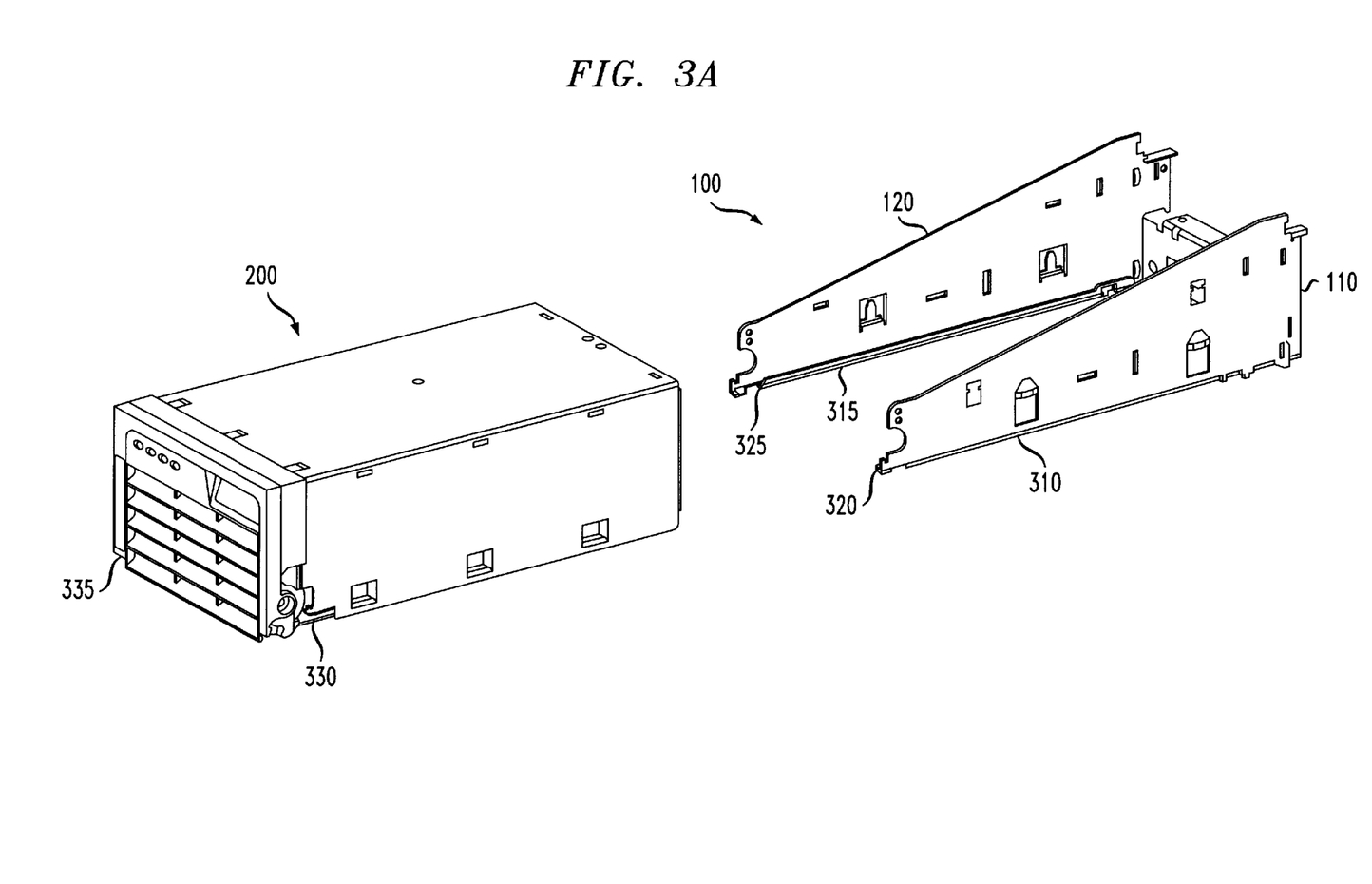
FIG. 3A illustrates an isometric view a receptacle and an electronics module with the module aligned to be inserted in the receptacle.
Figure 3B:
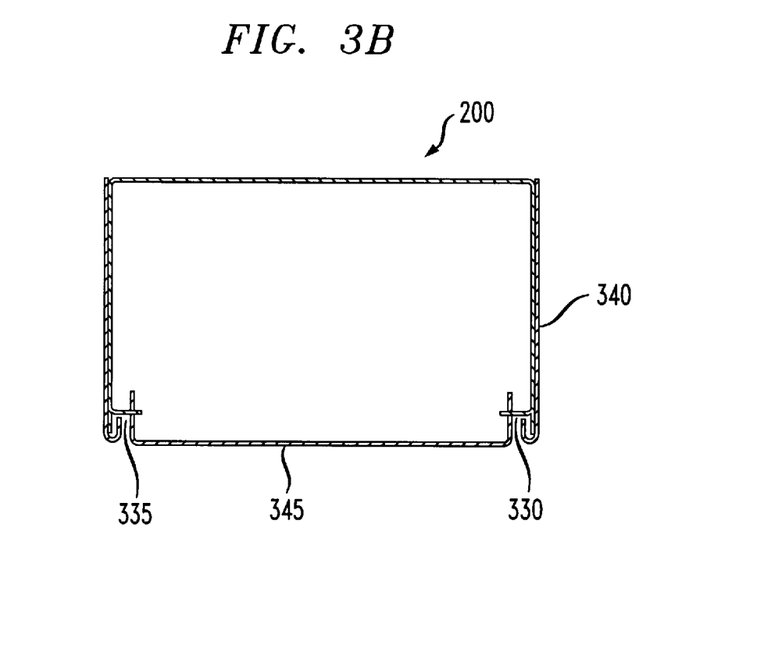
FIG. 3B illustrates a cross-sectional view of an electronics module cover showing the cover and lid forming rails at their juncture.
Figure 3C:
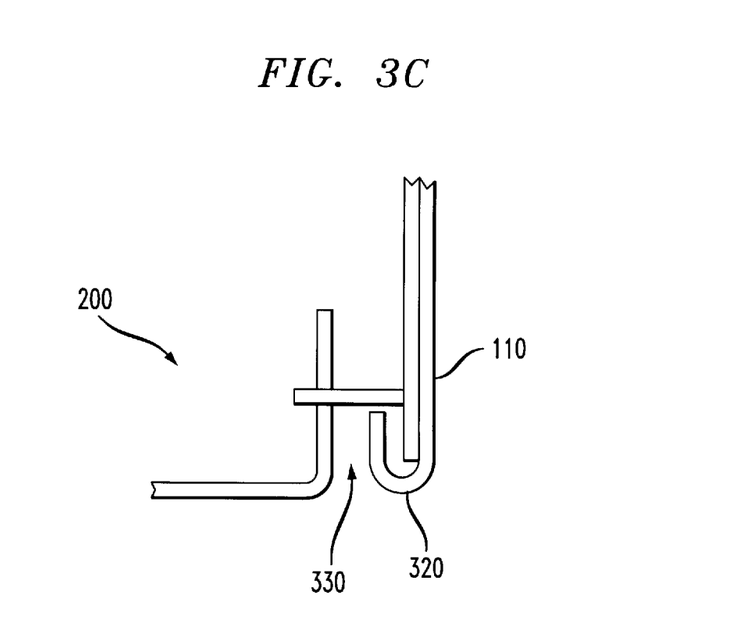
FIG. 3C illustrates a cross-sectional view of the module cover and lid juncture and the cooperation between the rail and one of the tracks after the module is installed in the receptacle.

Turning now to FIGS. 3A–3C, illustrated are various views of the receptacle 100 and the electronics module 200. FIG. 3A depicts the module 200 in a position from which it can be inserted in the receptacle 100. Each of the planar sidewalls 110, 120 has a bottom edge 310, 315 upon which a track 320, 325 may be formed. On the module 200 are rails 330, 335 (not visible) that are configured to be received by the tracks 320, 325, and guide the module 200 into position as it is being installed in the receptacle 100.

Illustrated in FIG. 3B is a cross-sectional view of the module 200 showing one embodiment of rails 330, 335 formed on the module 200. This embodiment uses the covering structure of the module 200 itself to form the rails 330, 335. The covering structure of the module 200 consists of a case 340 and a lid 345 that combine in a way that forms rails 330, 335 that can be used to insert the module 200 in the receptacle.

Illustrated in FIG. 3C is a cross-sectional view of a corner of the module 100 installed in the receptacle 200 showing the cooperation of the track 320 on the first planar sidewall 110 with a rail 330 on the module 200. As illustrated, after the module 200 is installed and secured, the rail 330 on the module 200 may no longer be physically supported by the track 320. This demonstrates that the function of the rail 330 and track 320 in certain embodiments of the invention may be limited to guiding the module 200 into position and does not necessarily provide additional support for the module 200. Those skilled in the art will understand, however, that the tracks 320, 325 can be used to provide support for the module 200 and still be within the scope of the present invention.

Figure 4:
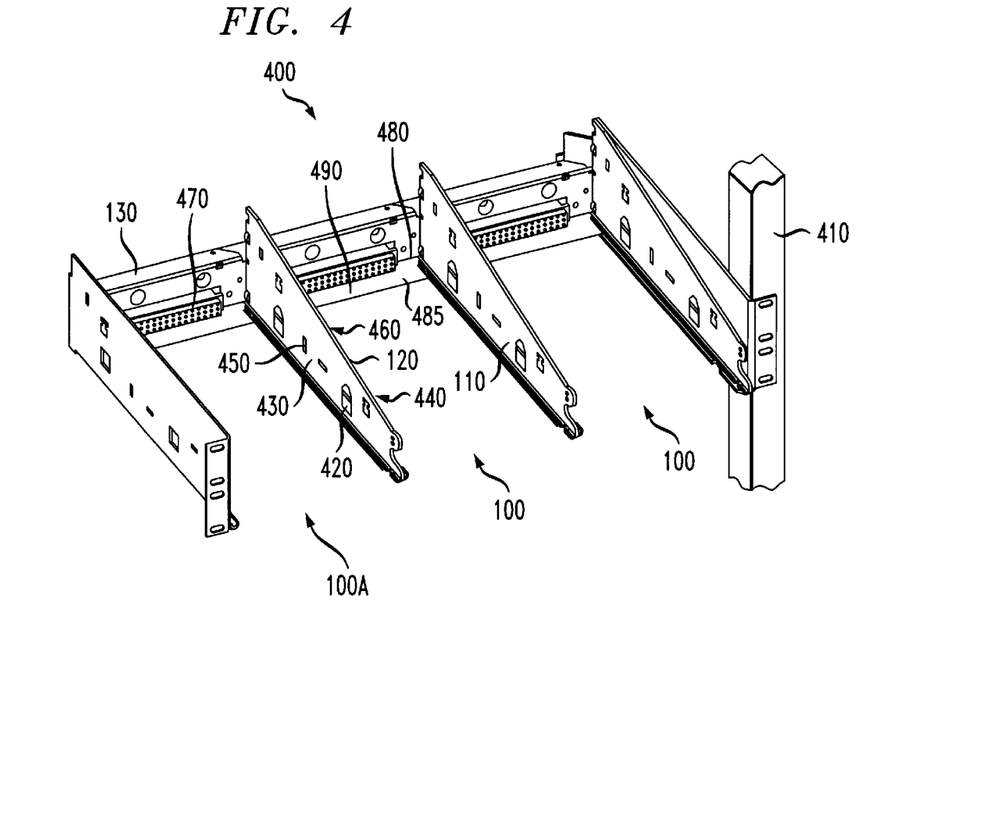
FIG. 4 illustrates an isometric view of a portion of an electronic equipment chassis with a series of three receptacles configured to hold modules coupled thereto.

Turning now to FIG. 4, illustrated is an isometric view of a portion of an electronic equipment chassis 400 with a series of three receptacles 100, 100A coupled thereto. The three receptacles 100, 100A are mounted adjacent to each other and then coupled to a frame 410 of the chassis 400. The receptacles 100, 100A are fastened together by a locking tab 420 on a third planar sidewall 430 of an adjacent receptacle 10A, contiguous to either the first or second planar sidewalls 110, 120. The locking tab 420 engages a corresponding tab receiver 440 (not visible) on the contiguous first or second planar sidewall 110, 120. Those of ordinary skill in the art will understand that the first or second planar sidewalls 110, 120 of one receptacle 100 will become the third planar sidewall 430 relative to an adjacent and contiguous receptacle 10A. Referring back to FIG. 1, the locking tab 420 on the second planar sidewall 120 is visible, as is the locking tab receiver 440 on the first planar sidewall 110.

In order to assure the correct alignment of receptacles 100, 100A with each other when a series of receptacles 100, 100A are put together, an alignment boss 450 on the third planar sidewall 430 cooperatively engages a corresponding boss receiver 460 (not visible) on the contiguous first or second planar sidewall 110, 120. Referring again to FIG. 1, the alignment bosses 450 and boss receivers 460 on the first and second planar sidewalls 110, 120 are visible. In a particularly useful aspect of this embodiment, a plurality of alignment bosses 450 is used to engage a plurality of boss receivers 460.

Figure 5:
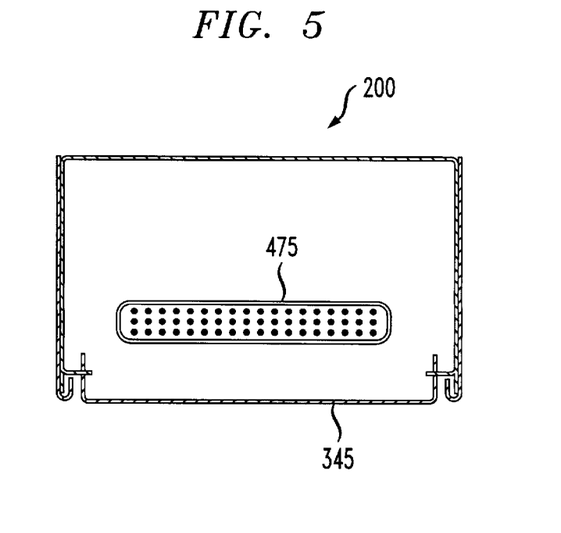
FIG. 5 illustrates a elevational rear view of a electronics module with its electrical connector.

Also illustrated in FIG. 4 is an electrical connector 470 coupled to the torsion bar 130. Illustrated in FIG. 5 is the planar rear view of a module 200 with its electrical connector 475. The electrical connector 475 on the module 200 and the electrical connector 470 on the torsion bar 130 are configured to cooperatively engage each other when the module 200 is installed in the receptacle 100.

FIG. 4 also illustrates an additional embodiment useful in installing the module 200 in the receptacle 100. Coupled to a bottom edge 480 of the torsion bar 130 is a guide plate 485 that extends towards the first and second planar sidewalls 110, 120. The guide plate 485 is configured to correctly align the module 200 in the receptacle 100 as it is being inserted by providing an alignment force or pressure against a bottom surface, such as the lid 345, of the module 200. This brings the electrical connector 475 on the module 200 in proper alignment with the electrical connector 470 on the torsion bar 130 as they are coupled together.

In order to keep the edge of the guide plate 485 from obstructing the module 200 as it is inserted, one aspect of this embodiment provides for an indentation 490 in a front edge of the guide plate 485. The indentation 490 permits the edges of the guide plate 485 adjacent the first and second planar sidewalls 110, 120 to first engage the module 200 as it is inserted. The guide plate 485 then engages the rest of the edge of the module 200 in a scissoring action to make an unobstructed insertion of the module 200 in the receptacle 100 while maintaining a continuous alignment pressure on the module 200.

Figure 6A:
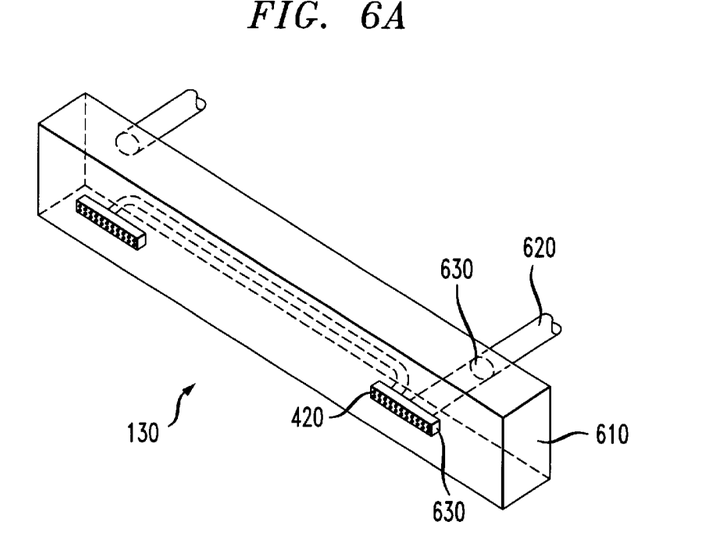
FIG. 6A illustrates an isometric view of an embodiment of a torsion bar with a wiring passageway formed therethrough.

Turning now to FIG. 6A illustrated is an isometric view of a particularly useful embodiment of a torsion bar 130 that has wiring passageway 610 formed through it. This permits electrical wiring 620 to be routed through the torsion bar 130 to provide input and/or output electrical connections to the modules 200 and to provide electrical interconnectivity between adjacent modules 200.

In order to get the wiring 620 in the torsion bar 130 and provide for the electrical connectors 470 that are installed on the torsion bar 130, apertures 630 are formed in the torsion bar 130. The apertures 630 compromise the structural strength of the torsion bar 130, to a certain extent, and also permit electromagnetic emissions caused by the wiring 620 to escape and cause electromagnetic interference (EMI).

Figure 6B:
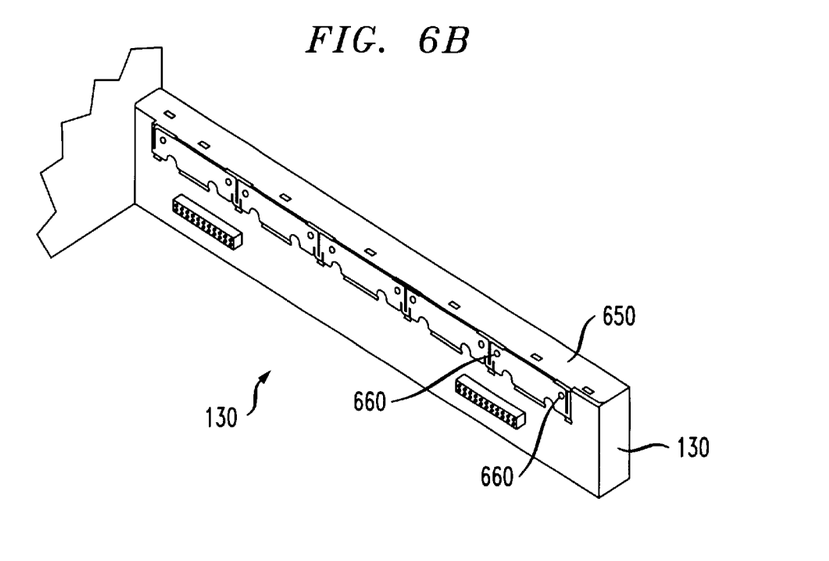
FIG. 6B illustrates an isometric view of an embodiment of an EMI cover istalled on the torsion bar illustrated in FIG. 6A.

Illustrated in FIG. 6B is one embodiment of an EMI cover 650 that can be installed to cover at least a portion of the torsion bar 130 to improve stiffness and help contain EMI emissions. This embodiment is described in detail in U.S. patent application, Ser. No. 09/370531, filed Aug. 9, 1999, U.S. Pat. No. 6,252,180, entitled "AN ELECTROMAGNETIC INTERFERENCE COVER FOR A CONDUIT AND AN ELECTRONIC EQUIPMENT CHASSIS EMPLOYING THE SAME" Buskmiller, et al., commonly assigned with the invention and incorporated herein by this reference.

In addition to the beneficial aspects of using the EMI cover 650 to provide stiffness and cover apertures 630, it can also be used to ground a module 200 to the same voltage potential as the chassis 400 and adjacent modules 200. Located on the EMI cover 650 is a boss 660 to make the grounding connection between the case 340 of the module 200 and the chassis 400. An EMI cover with a boss 660 and the details thereof are described further in Byrne, et. al.

Referring back to FIG. 4, the guide plate 485 illustrated therein also assists in the control of EMI emissions from the junction between the electrical connector 470 on the torsion bar 130 and the connector 475 on the module 200. The guide plate 485 encloses the bottom cavity that is created by the junction between the module 200 and the receptacle 100 and serves to contain EMI emissions. EMI emissions can still escape from the opening at the top of the juncture between the module 200 and the torsion bar 130, however, but these can also be controlled, in part, by the arrangement of the bosses 660 on the EMI cover 650. Multiple bosses 660 can be used to reduce the uninterrupted size of the opening thereby shortening the wavelength of any EMI emissions. The distance between bosses 660 on the EMI cover 650, as well as the distance between a boss 660 and an adjacent planar sidewall 110, 120 will serve to define the size of any opening and, thus, the wavelength of any EMI emissions.

The method of manufacturing an electronics system chassis, including the receptacles described herein, is clear to one of ordinary skill in the art from the foregoing description and illustrations.

In conclusion, although the present invention has been described in detail, those skilled in the art should understand that they can make various changes, substitutions and alterations herein without departing from the spirit and scope of the invention in its broadest form.

What is claimed is:

1. For use with an electronics equipment chassis, a receptacle configured to receive an electronics module, comprising:
    a torsion bar;
    a first planar sidewall having a boss located on an inside planar surface thereof, said boss configured to cooperatively engage a first notch formed on a side wall of said electronics module and further having a semicircular locking slot formed in a front edge of said first planar sidewall configured to receive a first locking cam associated with said electronics module, said semicircular locking slot cooperating with said locking cam and said boss to create a longitudinal compressive force along said first planar sidewall, said first planar sidewall coupled to said torsion bar; and
    a second planar sidewall coupled to said torsion bar and opposing said first planar sidewall.

2. The receptacle as recited in claim 1 wherein said second planar sidewall includes a boss on the inside planar surface thereof, said boss of said second planar sidewall configured to cooperatively engage a second notch formed on a side wall of said electronics module and further having a semicircular locking slot formed in a front edge of said second planar sidewall configured to receive a second locking cam associated with said electronics module, said semicircular locking slot of said second planar sidewall cooperating with said second locking cam and said boss of said second planar sidewall to create a longitudinal compressive force along said second planar sidewall.

3. The receptacle as recited in claim 1 wherein said first planar sidewall includes a track located on the bottom edge of said first planar sidewall, said track configured to receive and guide said electronics module.

4. The receptacle as recited in claim 1 wherein said second planar sidewall includes a track located on the bottom edge of said second planar sidewall, said track configured to receive and guide said electronics module.

5. The receptacle as recited in claim 1 further comprising a third planar sidewall of an adjacent receptacle, said third planar sidewall contiguous with either of said first or second planar sidewalls and having a locking tab formed thereon, either of said first or second planar sidewalls having a corresponding locking tab receiver formed thereon configured to cooperatively engage said locking tab and secure said third planar sidewall to either of said first or second planar sidewalls.

6. The receptacle as recited in claim 1 further comprising a third planar sidewall of an adjacent receptacle, said third planar sidewall contiguous with either of said first or second planar sidewalls and having an alignment boss formed thereon, either of said first or second planar sidewalls having a corresponding alignment boss receiver formed thereon configured to cooperatively engage said alignment boss.

7. The receptacle as recited in claim 1 further comprising an electrical connector coupled to said torsion bar configured to cooperatively engage a corresponding electrical connector on said electronics module.

8. The receptacle as recited in claim 1 wherein said torsion bar includes a wiring passageway formed therethrough.

9. The receptacle as recited in claim 1 further includes an electromagnetic interference (EMI) cover configured to cover at least a portion of said torsion bar.

10. The receptacle as recited in claim 1 further comprising a guide plate coupled to a bottom edge of said torsion bar, said guide plate extending from said bottom edge of said torsion bar toward said first and second planar sidewalls, said guide plate configured to provide an alignment force against a bottom surface of said electronics module.

11. The receptacle as recited in claim 10 wherein said guide plate includes a front edge located adjacent said first and second planar sidewalls and having an indentation formed therein to provide a scissoring action between an edge of said electronics module and said guide plate.

12. An electronics equipment chassis, comprising:
    a frame; and
    an electronics module receptacle coupleable to said frame, said receptacle including:
        a torsion bar;
        a first planar sidewall having a boss located on an inside planar surface thereof, said boss configured to cooperatively engage a notch formed on a side wall of said electronics module and further having a semicircular locking slot formed in a front edge of said first planar sidewall configured to receive a locking cam associated with said electronics module, said semicircular locking slot cooperating with said locking cam and said boss to create a longitudinal compressive force along said first planar sidewall, said first planar sidewall coupled to said torsion bar; and
        a second planar sidewall coupled to said torsion bar and opposing said first planar sidewall.

13. The electronics equipment chassis as recited in claim 12 wherein said second planar sidewall of said receptacle includes a boss located on the inside planar surface thereof, said boss configured to cooperatively engage a notch formed on a rear wall of said electronics module and further having a semicircular locking slot formed in a front edge of said second planar sidewall configured to receive a locking cam associated with said electronics module, said semicircular locking slot cooperating with said locking cam and said boss to create a longitudinal compressive force along said second planar sidewall.

14. The electronics equipment chassis as recited in claim 12 wherein said first planar sidewall of said receptacle includes a track located on the bottom edge of said first planar sidewall, said track configured to receive and guide said electronics module.

15. The electronics equipment chassis as recited in claim 12 wherein said second planar sidewall of said receptacle includes a track located on the bottom edge of said second planar sidewall, said track configured to receive and guide said electronics module.

16. The electronics equipment chassis as recited in claim 12 wherein said receptacle further includes a third planar sidewall of an adjacent receptacle, said third planar sidewall contiguous with either of said first or second planar sidewalls and having a locking tab formed thereon, either of said first or second planar sidewalls having a corresponding locking tab receiver formed thereon configured to cooperatively engage said locking tab and secure said third planar sidewall to either of said first or second planar sidewalls.

17. The electronics equipment chassis as recited in claim 12 further including a third planar sidewall of an adjacent receptacle, said third planar sidewall contiguous with either of said first or second planar sidewalls and having an alignment boss formed thereon, either of said first or second planar sidewalls having a corresponding alignment boss receiver formed thereon configured to cooperatively engage said alignment boss.

18. The electronics equipment chassis as recited in claim 12 further comprising an electronics module having a electrical connector coupled thereto and configured to be received in said electronics module receptacle and wherein said electronics module receptacle further includes a corresponding electrical connector to cooperatively engage said electrical connector.

19. The electronics equipment chassis as recited in claim 18 wherein said torsion bar includes a wiring passageway formed therethrough.

20. The electronics equipment chassis as recited in claim 19 wherein said receptacle further includes an electromagnetic interference (EMI) cover configured to cover at least a portion of said torsion bar.

21. The electronics equipment chassis as recited in claim 12 wherein said receptacle further includes a guide plate coupled to a bottom edge of said torsion bar, said guide plate extending from said bottom edge of said torsion bar toward said first and second planar sidewalls, said guide plate configured to provide an alignment force against a bottom surface of said electronics module.

22. The electronics equipment chassis as recited in claim 21 wherein said guide plate includes a front edge located adjacent said first and second planar sidewalls and having an indentation formed therein to provide a scissoring action between an edge of said electronics module and said guide plate.

23. The electronics equipment chassis as recited in claim 12 further including a plurality of said electronics equipment receptacles.

24. The electronics equipment chassis as recited in claim 23 further including a plurality of electronics modules coupleable thereto.

25. A method of manufacturing a receptacle configured to receive an electronics module for use with an electronics equipment chassis, comprising:
forming a torsion bar;
forming a first planar sidewall having a boss located on an inside planar surface thereof, said boss configured to cooperatively engage a notch formed on a side wall of said electronics module and further having a semicircular locking slot formed in a front edge of said first planar sidewall configured to receive a locking cam associated with said electronics module, said semicircular locking slot cooperating with said locking cam and said boss to create a longitudinal compressive force along said first planar sidewall, said first planar sidewall coupled to said torsion bar; and
forming a second planar sidewall coupled to said torsion bar and opposing said first planar sidewall.

26. The method of manufacturing a receptacle as recited in claim 25 wherein said second planar sidewall includes a boss on the inside planar surface thereof, said boss configured to cooperatively engage a notch formed on a side wall of said electronics module and further having a semicircular locking slot formed in a front edge of said second planar sidewall configured to receive a locking cam associated with said electronics module, said semicircular locking slot cooperating with said locking cam and said boss to create a longitudinal compressive force along said second planar sidewall.

27. The method of manufacturing a receptacle as recited in claim 25 wherein said first planar sidewall and said second planar sidewall include a track located on the bottom edge of said first planar sidewall and said second planar sidewall, said tracks configured to receive and guide said electronics module.

28. A method of manufacturing a receptacle as recited in claim 25 further including forming a third planar sidewall of an adjacent receptacle, said third planar sidewall contiguous with either of said first or second planar sidewalls and having an alignment boss and a locking tab formed thereon, either of said first or second planar sidewalls having a corresponding boss receiver and locking tab receiver formed thereon configured to cooperatively engage said boss receiver and locking tab and align and secure said third planar sidewall to either of said first or second planar sidewalls.

29. A method of manufacturing a receptacle as recited in claim 25 wherein said torsion bar includes a wiring passageway formed therethrough and further including an electrical connector coupled to said torsion bar configured to cooperatively engage a corresponding electrical connector on said electronics module.

30. A method of manufacturing a receptacle as recited in claim 25 further including forming a guide plate coupled to a bottom edge of said torsion bar, said guide plate extending from said bottom edge of said torsion bar toward said first and second planar sidewalls and configured to provide an alignment force against said bottom edge of said electronics module and further including a front edge of said guide plate adjacent said first and second planar sidewalls said front edge having an indentation formed therein to provide a scissoring action between and edge of said electronics module and said guide plate.

31. A method of manufacturing an electronics equipment chassis, comprising:
forming a frame; and
forming an electronics module receptacle coupleable to said frame, forming said receptacle including:
forming a torsion bar;
forming a first planar sidewall having a boss located on an inside planar surface thereof, said boss configured to cooperatively engage a notch formed on a side wall of said electronics module and further having a semicircular locking slot formed in a front edge of said first planar sidewall configured to receive a locking cam associated with said electronics module, said semicircular locking slot cooperating with said locking cam and said boss to create a longitudinal compressive force along said first planar sidewall, said first planar sidewall coupled to said torsion bar; and forming a second planar sidewall coupled to said torsion bar and opposing said first planar sidewall.

32. A method of manufacturing an electronics equipment chassis as recited in claim 31 wherein said second planar sidewall includes a boss on the inside planar surface thereof, said boss configured to cooperatively engage a notch formed on a side wall of said electronics module and further having a semicircular locking slot formed in a front edge of said second planar sidewall configured to receive a locking cam associated with said electronics module, said semicircular locking slot cooperating with said locking cam and said boss to create a longitudinal compressive force along said second planar sidewall.

33. A method of manufacturing an electronics equipment chassis as recited in claim 31 wherein said first planar sidewall and said second planar sidewall include a track located on the se bottom edge of said first planar sidewall and said second planar sidewall, said track configure d to receive and guide said electronics module.

34. A method of manufacturing an electronics equipment chassis as recited in claim 31 further including forming a third planar sidewall of an adjacent receptacle, said third planar sidewall contiguous with either of said first or second planar sidewalls and having an alignment boss and a locking tab formed thereon, either of said first or second planar sidewalls having a corresponding boss receiver and locking tab receiver formed thereon configured to cooperatively engage said boss receiver and locking tab and align and secure said third planar sidewall to either of said first or second planar sidewalls.

35. A method of manufacturing an electronics equipment chassis as recited in claim 31 wherein said torsion bar includes a wiring passageway formed therethrough and further including an electrical connector coupled to said torsion bar configured to cooperatively engage a corresponding electrical connector on said electronics module.

36. A method of manufacturing an electronics equipment chassis as recited in claim 31 further including forming a guide plate coupled to a bottom edge of said torsion bar, said guide plate extending from said bottom edge of said torsion bar toward said first and second planar sidewalls and configured to provide an alignment force against said bottom edge of said electronics module and further including a front edge of said guide plate adjacent said first and second planar sidewalls said front edge having an indentation formed therein to provide a scissoring action between an edge of said electronics module and said guide plate.

* * * * *